(12) United States Patent
Carinci et al.

(10) Patent No.: US 11,624,796 B2
(45) Date of Patent: Apr. 11, 2023

(54) CORRECTION OF TOF MR DATA

(71) Applicant: Siemens Healthcare GmbH, Erlangen (DE)

(72) Inventors: Flavio Carinci, Würzburg (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/678,665

(22) Filed: Feb. 23, 2022

(65) Prior Publication Data
US 2022/0268868 A1 Aug. 25, 2022

(30) Foreign Application Priority Data
Feb. 23, 2021 (DE) .......................... 102021201676.6

(51) Int. Cl.
*G01R 33/563* (2006.01)
*G01R 33/483* (2006.01)
*G01R 33/561* (2006.01)
*G01R 33/56* (2006.01)

(52) U.S. Cl.
CPC ..... *G01R 33/5635* (2013.01); *G01R 33/4838* (2013.01); *G01R 33/5608* (2013.01); *G01R 33/5611* (2013.01)

(58) Field of Classification Search
CPC ............ G01R 33/4838; G01R 33/5608; G01R 33/5611; G01R 33/5635
See application file for complete search history.

(56) References Cited

U.S. PATENT DOCUMENTS

| | | | |
|---|---|---|---|
| 7,330,028 B2 * | 2/2008 | Zhao | G01R 33/56308 |
| | | | 324/309 |
| 10,871,537 B1 * | 12/2020 | Guo | G01R 33/3815 |
| 2010/0128952 A1 * | 5/2010 | Schmitt | G06T 5/008 |
| | | | 382/131 |

* cited by examiner

Primary Examiner — Gregory H Curran
(74) Attorney, Agent, or Firm — Banner & Witcoff Ltd.

(57) ABSTRACT

A method for correcting TOF MR data, including providing a coil sensitivity map for an examination region of an examination object, providing the TOF MR data of the examination region, and generating corrected TOF MR image data comprising multiplying the TOF MR data by an inverse of the coil sensitivity map.

11 Claims, 3 Drawing Sheets

CORRECTION OF TOF MR DATA

TECHNICAL FIELD

The disclosure relates to a method, a magnetic resonance device, a computer program product and an electronically readable data carrier for correcting TOF MR data.

BACKGROUND

In a magnetic resonance device, the body to be examined of an examination object, particularly that of a patient, is typically exposed to a relatively strong main magnetic field of, for example, 1.5 or 3 or 7 tesla, with the aid of a main magnet. In addition, gradient pulses are output with the aid of a gradient coil unit. High-frequency radio-frequency pulses, for example excitation pulses, are then transmitted via a radio-frequency antenna unit by means of suitable antenna facilities, with the result that the nuclear spins of particular atoms resonantly excited by these radio-frequency pulses are tilted by a defined flip angle compared to the magnetic field lines of the main magnetic field. When the nuclear spins are relaxed, radio-frequency signals known as magnetic resonance signals are emitted, and are received and then further processed using suitable radio-frequency antennas. From the raw data acquired in this way, the desired image data can finally be reconstructed.

For a particular scan, a particular magnetic resonance control sequence (MR control sequence), also known as a pulse sequence, which consists of a sequence of radio-frequency pulses, for example excitation pulses and refocusing pulses, as well as gradient pulses to be transmitted suitably coordinated therewith on various gradient axes along different spatial directions, is therefore to be transmitted. Timed to coincide with this, readout windows are set which define the time periods in which the induced magnetic resonance signals are acquired.

In magnetic resonance imaging (MR imaging), time-of-flight (TOF) imaging is to be understood to mean a method in angiography for visualizing blood vessels which is free from the administration of contrast agent to the examination object. TOF imaging is typically used to examine the head, if the examination region therefore comprises the head of the examination object. The MR control sequence used for TOF imaging (TOF MR control sequence) is typically gradient-echo-based and embodied such that blood flowing in has a particularly high signal intensity in the corresponding TOF MR image data reconstructed from the raw data recorded by means of the TOF MR control sequence, wherein MR signals of other tissues are suppressed. This enables in particular a good representation of the TOF MR image data as a projection, in particular as a projection of the maximum intensity in the form of what is known as maximum intensity projection image data (MIP image data), on the basis of which a physician can make a particularly accurate diagnosis. Here, the suppression of MR signals of other tissues during the MR control sequence is particularly important because the MR signals of other tissues superimpose themselves onto the blood vessels to be represented in the MIP image data and form artifacts, in particular in the case of small blood vessels. Other tissue which, in addition to blood vessels, has a particularly high signal intensity in TOF imaging and thus potentially has a negative influence on a diagnosis comprises in particular fat.

SUMMARY

The disclosure is based on the object of specifying a particularly simple and precise method for correcting TOF MR data, in particular for reducing MR signals originating from tissue outside of blood vessels in TOF MR data. The object is achieved with the features of the independent claims. Advantageous aspects are disclosed in the dependent claims.

The method according to the disclosure for correcting TOF MR data provides the following method steps:
providing a coil sensitivity map for an examination region of an examination object,
providing the TOF MR data of the examination region,
generating corrected TOF MR image data comprising multiplying the TOF MR data by an inverse of the coil sensitivity map.

The examination object is typically a patient and/or a person. The examination region is typically a spatial subregion of the examination object, from which subregion image data, in particular corrected TOF MR image data, is generated from the examination object. The examination region preferably comprises at least one blood vessel. The TOF MR data typically comprises MR signals and/or is based on MR signals from the examination region of the examination object. TOF MR data is typically raw data or image data recorded with a TOF MR control sequence. If the TOF MR data is embodied as image data, then the TOF MR data can map the examination region in a certain contrast. If the TOF MR data is embodied as raw data, then the method preferably comprises reconstructing the raw data to form image data. Providing the TOF MR data can comprise recording the TOF MR data from the examination object by means of a magnetic resonance device.

A coil sensitivity map comprises a spatially resolved coil sensitivity of a receive coil unit in the sensitivity range of the receive coil unit. A receive coil unit comprises at least one radio-frequency antenna embodied to receive the magnetic resonance signals emitted in the sensitivity range. The receive coil unit typically at least partially encloses the sensitivity range. The coil sensitivity for a position, typically within the sensitivity range, typically comprises a measure for a receive strength of the receive coil unit at the position, in particular for receiving magnetic resonance signals emitted at the position. The coil sensitivity at a position typically depends on the positioning of at least one radio-frequency antenna and/or on the distance of at least one radio-frequency antenna from the position. The examination region and the sensitivity range typically overlap one another at least partially. The examination region is typically a subregion of the sensitivity range. The coil sensitivity map preferably has a spatial resolution. The coil sensitivity map is typically dependent on the receive coil unit and the examination object.

Providing the coil sensitivity map can comprise recording the coil sensitivity map from the examination object by means of a magnetic resonance device. The coil sensitivity map and the TOF MR data in each case comprise data from the examination region of the examination object. The coil sensitivity map and/or the TOF MR data can also comprise data from a larger spatial region which comprises the examination region, such as for example the sensitivity range.

The coil sensitivity map is typically determined during a conventional MR imaging method, for example during a preliminary scan, in particular a calibration scan. The coil sensitivity map for a local receive coil unit can be established by recording identical MR signals by means of the local receive coil unit and by means of the radio-frequency antenna unit (body coil), which is embodied to emit radio-frequency pulses, and by forming the corresponding ratio for each position of the sensitivity range of the local receive coil unit. The coil sensitivity map is typically used when reconstructing raw data to form image data. The coil sensitivity map can conventionally also be used for homogenizing and/or normalizing the image data.

The multiplication of the TOF MR data by an inverse of the coil sensitivity map preferably takes place voxel by voxel. The multiplication of the TOF MR data by an inverse of the coil sensitivity map can comprise an interpolation. One aspect of the method according to the disclosure can comprise providing the corrected TOF MR image data. One aspect of the method according to the disclosure can comprise generating MIP image data from the corrected TOF MR image data.

The method according to the disclosure enables the TOF MR data to be corrected with the aid of the coil sensitivity map, which coil sensitivity map is also used in other conventional methods to generate image data reconstructed from TOF MR data. The coil sensitivity map typically has a lower strength in regions of blood vessels within the examination region than in regions surrounding the blood vessels within the examination region. The MR signals originating from tissue outside of blood vessels are consequently reduced in the corrected TOF MR image data. Reducing and/or suppressing the background signals enables a more detailed view of blood vessels in the corrected TOF MR image data, in particular also a representation of small blood vessels. The corrected TOF MR image data consequently represents blood vessels particularly clearly and enables a reliable diagnosis, even when MIP image data is generated from the corrected TOF MR image data. The TOF MR data can be corrected on the basis of existing data, in particular the coil sensitivity map, and consequently in a particularly time-efficient manner.

One aspect of the method provides that the provision of the TOF MR data comprises recording TOF MR raw data from the examination object by means of a magnetic resonance device and reconstructing the TOF MR raw data to form image data, and that the TOF MR data is embodied as image data. Recording TOF MR raw data by means of a magnetic resonance device preferably comprises actuating the magnetic resonance device according to a TOF MR control sequence. This aspect preferably takes place during a medical examination of the examination object, comprising recording the coil sensitivity map and actuating the magnetic resonance device according to at least two MR control sequences. One of the at least two MR control sequences is accordingly embodied as a TOF MR control sequence for recording TOF MR data.

One aspect of the method provides that the reconstruction of the TOF MR raw data to form image data takes place taking into consideration the coil sensitivity map. Reconstructing the TOF MR raw data to form image data taking into consideration the coil sensitivity map typically comprises correcting and/or homogenizing local inhomogeneities, which typically occur when using at least one local receive coil unit comprising several radio-frequency antennas. If the coil sensitivity map is used when generating the TOF MR data, in particular when reconstructing the TOF MR raw data to form image data, then the coil sensitivity map is used at least twice within the scope of this aspect. Reconstructing the TOF MR raw data to form image data taking into consideration the coil sensitivity map can comprise multiplying the TOF MR data by an inverse of the coil sensitivity map. Such TOF MR data is typically particularly homogeneous. The generation of corrected TOF MR image data and correction is accordingly based on particularly high-quality TOF MR data. Regions, particularly central regions of the examination region, in which the reduction and/or suppression of the background signals is of below-average relevance and/or in which the coil sensitivity map in particular has a below-average amplitude, of the corrected TOF MR image data accordingly have a particularly homogeneous and high image quality. This aspect enables the TOF MR data to be corrected particularly efficiently. Reconstructing the TOF MR raw data to form image data can also take place taking into consideration a further coil sensitivity map.

One aspect of the method provides that the coil sensitivity map has lower value in a central region of the examination region than in a peripheral region of the examination region. In particular the mean value of the coil sensitivity of the central region is lower than the mean value of the coil sensitivity of the peripheral region.

This aspect preferably comprises recording TOF MR raw data by means of a magnetic resonance device using a head coil as the receive coil unit during provision of the TOF MR data, wherein a coil sensitivity map with a lower value in the central region of the examination region than in a peripheral region of the examination region is assigned to the receive coil unit.

The examination region preferably comprises a head. Fat comprised by the head is typically mostly subcutaneous fat surrounding the skull and in the region of the eyes. Accordingly, tissue comprising fat typically occurs in a peripheral region in the head as the examination region. Blood vessels mostly occur in the central region of the head. A coil sensitivity map having a higher coil sensitivity in the peripheral region than in the central region of the examination region accordingly enables a reduction in the signal intensity of the peripheral region comprising tissue comprising fat, which fat typically has a high signal intensity particularly in TOF MR data. Accordingly, this aspect enables a reduction in the signal generated by tissue, particularly by fat, outside the blood vessels and thus a particularly good suppression of background signals. Accordingly, the blood vessels are particularly easily identifiable in the corrected TOF MR image data.

One aspect of the method provides that the TOF MR data is embodied as image data and has a higher spatial resolution than the coil sensitivity map. The coil sensitivity map is used to correct the TOF MR data and can accordingly have a different, in particular a lower spatial resolution. This enables the resolution of the TOF MR data to be selected independently from the coil sensitivity map. As a result, it is possible to dispense with a dedicated recording of the coil sensitivity map in alignment with the TOF MR data provided, thereby enabling the method to be carried out particularly quickly.

One aspect of the method provides that multiplying the TOF MR data by an inverse of the coil sensitivity map comprises multiplying the TOF MR data by an inverse of a compensation factor. The compensation factor is preferably consistent for the examination region and/or for the coil sensitivity map. The compensation factor can be selected such that the correction of the TOF MR data is intensified or attenuated. According to this aspect, the TOF MR data is preferably divided by the coil sensitivity map and the compensation factor. If the compensation factor is greater than 1, for example, then the correction of the TOF MR data can be intensified. For example, in this way the corrected TOF MR image data can have almost no signal and/or be overcompensated in peripheral regions. If for example a compensation factor less than 1 is selected, then the correction can be attenuated. This aspect accordingly enables the TOF MR data to be corrected flexibly.

One aspect of the method provides that the compensation factor has a value of at least 1.1. The compensation factor can have a value of at least 1.2, preferably of at least 1.5, particularly preferably of at least 1.7. The compensation factor can have a value of at most 2.9, preferably of at most 2.6, particularly preferably of at most 2.3. This aspect takes place preferably without considering the coil sensitivity map when reconstructing the TOF MR raw data to form image data and/or without homogenizing the TOF MR data during provision. In particular, the TOF MR data according to this aspect is preferably free from homogenization by means of the coil sensitivity map. Within the scope of this aspect, the TOF MR data is preferably embodied as image data. If the compensation factor were to have the value 1, then without consideration of the coil sensitivity map when reconstructing the TOF MR raw data to form image data, this aspect would correspond to the homogenization, in particular the normalization of the TOF MR data, which takes place during conventional MR imaging, during generation of the corrected TOF MR image data from the TOF MR data. If the compensation factor has a value greater than 1, in particular greater than 1.1, then the background signals are additionally reduced and/or suppressed. This aspect preferably combines the homogenization, in particular the normalization of the TOF MR data, which takes place during conventional MR imaging, and the reduction and/or suppression of the background signals, which is advantageous in particular during TOF imaging.

One aspect of the method provides that the provision of the TOF MR data comprises actuating a magnetic resonance device according to an MR control sequence and the magnetic resonance device has a main magnetic field of at most 1.3 tesla.

The actuation of the magnetic resonance device takes place in particular according to a TOF MR control sequence.

The magnetic resonance device typically has a main magnetic field of at most 1.0 tesla, preferably of at most 0.7 tesla, particularly preferably of at most 0.58 tesla. In this aspect, the magnetic resonance device typically has a main magnetic field of at least 0.01 tesla, preferably of at least 0.1 tesla, particularly preferably of at least 0.3 tesla. TOF MR control sequences are typically gradient-echo-based and/or T1-weighted. The shorter the T1 relaxation time of a tissue, the greater the signal intensity typically is in the corresponding TOF MR data. The lower the strength of the main magnetic field of the magnetic resonance device, the stronger the contrast typically is in the corresponding TOF MR data between tissues having a particularly short T1 relaxation time and tissues having an average T1 relaxation time. In TOF MR data recorded with a magnetic resonance device having a main magnetic field of at most 1.3 tesla, tissues with a shorter T1 relaxation time, such as for example fat, appear brighter than in TOF MR data recorded with a magnetic resonance device having a main magnetic field of tesla. According to this aspect, a particularly strong background signal is accordingly present from tissue having a short T1 relaxation time, which makes a diagnosis of blood vessels particularly difficult when using a conventional method. This aspect of the method according to the disclosure enables an efficient correction independently of a T1 relaxation time.

One aspect of the method provides that the provision of the TOF MR data comprises actuating a magnetic resonance device according to an MR control sequence free from fat saturation.

Fat has a particularly short T1 relaxation time in comparison to other tissue, which is why it appears particularly bright in TOF MR data recorded with a TOF MR control sequence free from fat saturation. Fat appears with a similar brightness to blood vessels in TOF MR data, which is why a diagnosis of blood vessels through fat is typically made particularly difficult. This aspect typically enables a correction of the bright signal based on the coil sensitivity map, as a result of which it is possible to dispense with a fat saturation when selecting the TOF MR control sequence.

Methods for fat saturation, such as for example spectral attenuated inversion recovery (SPAIR), spectral excitation and/or spectral saturation reduce the signal originating from fat but generate other artifacts which are of relevance in terms of certainty, particularly during TOF imaging. The blood appearing bright in the TOF MR data typically flows from a peripheral region of the examination region into a central region during the recording of the TOF MR data, in other words when the TOF MR control sequence is played out. Strong off-resonances frequently occur in the peripheral region and are suppressed when a spectral fat saturation is used, as a result of which the blood of relevance to the TOF imaging can also be affected. This can lead for example to shadows in the blood vessels, which can imitate a pathology. By dispensing with the fat saturation, such artifacts can be avoided and the influence of the fat on the corrected TOF MR image data and in particular on MIP image data generated therefrom can nevertheless be suppressed.

Furthermore, the disclosure is based on a magnetic resonance device with a control unit comprising a correction unit. The correction unit is embodied to carry out a method according to the disclosure for correcting TOF MR data.

For this purpose, the correction unit typically has an input, a processor unit and an output. A coil sensitivity map, TOF MR data, a compensation factor and/or an algorithm for reconstructing the TOF MR raw data to form image data can be provided to the correction unit via the input. Further functions, algorithms or parameters required in the method can be provided to the correction unit via the input. The corrected TOF MR image data and/or further results of an aspect of the method according to the disclosure can be provided via the output. The correction unit can be integrated into the magnetic resonance device. The correction unit can also be installed separately from the magnetic resonance device. The correction unit can be connected to the magnetic resonance device.

Aspects of the magnetic resonance device according to the disclosure are configured similarly to the aspects of the method according to the disclosure. The magnetic resonance device can have further control components which are necessary and/or advantageous for carrying out a method according to the disclosure. The magnetic resonance device can also be configured to transmit control signals and/or to receive and/or process control signals in order to carry out a method according to the disclosure. The correction unit is preferably part of the control unit of the magnetic resonance device according to the disclosure. In a memory unit of the correction unit, computer programs and other software can be stored, by means of which the processor unit of the correction unit automatically controls and/or carries out a sequence of a method according to the disclosure.

A computer program product according to the disclosure is directly loadable into a memory unit of a programmable correction unit and has program code means in order to carry out a method according to the disclosure when the computer program product is executed in the correction unit. As a result, the method according to the disclosure can be carried out in a rapid, exactly reproducible and robust manner. The computer program product is configured such that it can carry out the method steps according to the disclosure by means of the correction unit. In this context, the correction unit must in each case have the requirements, such as for example a corresponding RAM, a corresponding graphics card or a corresponding logic unit, in order to be able to carry out the respective method steps efficiently. The computer program product is stored for example on an electronically readable medium or is deposited on a network or server, from where it can be loaded into the processor of a local correction unit which can be directly connected to the magnetic resonance device or embodied as part of the magnetic resonance device. In addition, control information of the computer program product can be stored on an electronically readable data carrier. The control information of the electronically readable data carrier can be embodied such that it carries out a method according to the disclosure when the data carrier is used in a correction unit of a magnetic resonance device. Examples of electronically readable data carriers are a DVD, a magnetic tape or a USB stick, on which electronically readable control information, in particular software, is stored. If this control information (software) is read from the data carrier and stored in a control unit and/or correction unit of a magnetic resonance device, all aspects according to the disclosure of the methods described above can be carried out.

The disclosure also relates to an electronically readable data carrier on which a program is stored which is provided for carrying out a method for correcting TOF MR data.

The advantages of the magnetic resonance device according to the disclosure, the computer program product according to the disclosure and the electronically readable data carrier according to the disclosure substantially correspond to the advantages of the method according to the disclosure for correcting TOF MR data, as described in detail above. Features, advantages or alternative aspects mentioned herein can likewise also be transferred to the other claimed subject matters and vice versa.

BRIEF DESCRIPTION OF THE DRAWINGS

Further advantages, features and details of the disclosure are disclosed in the following description of exemplary aspects and with reference to the drawings, in which.

DETAILED DESCRIPTION

Figure 1:
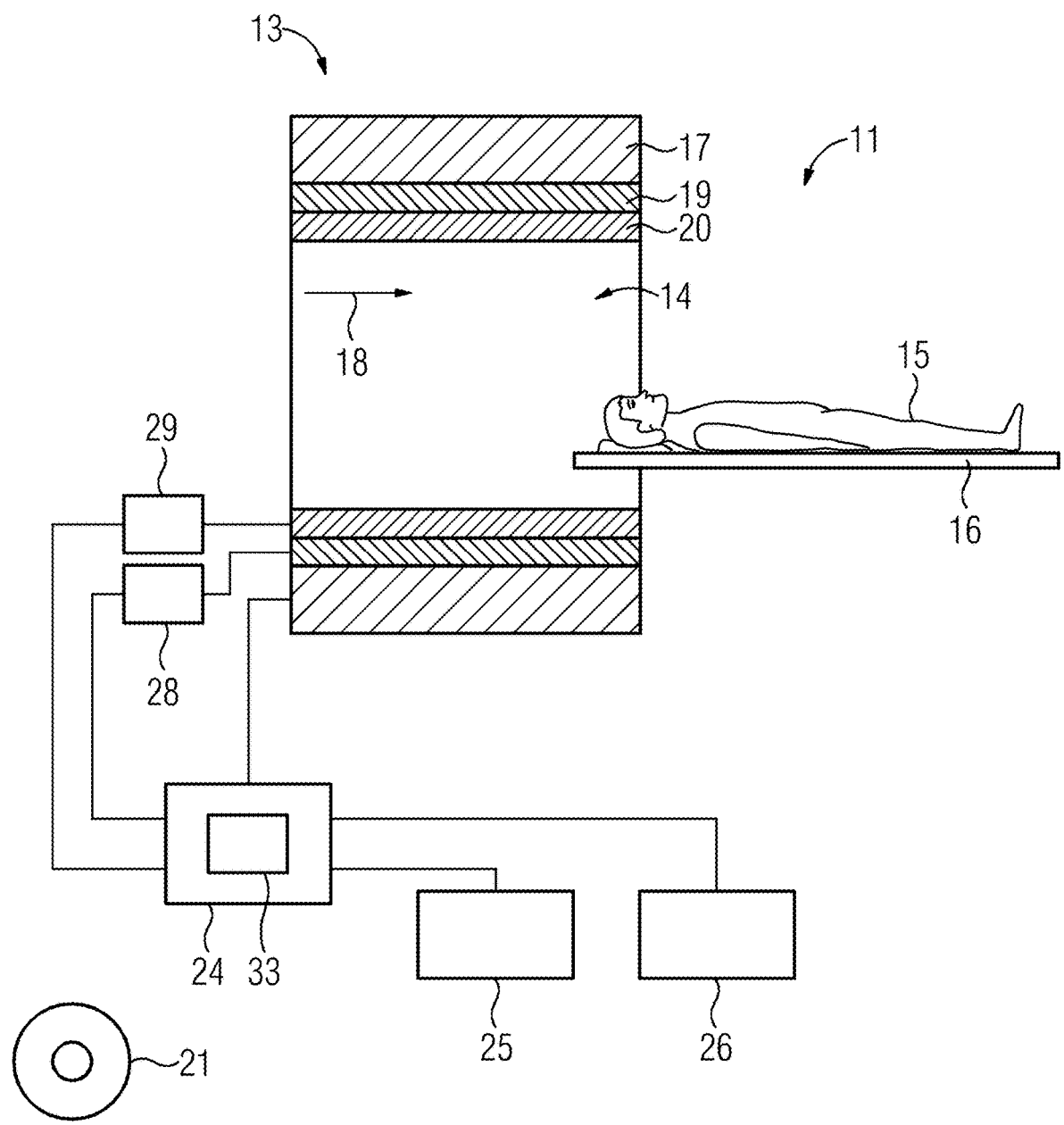
FIG. 1 shows a magnetic resonance device according to the disclosure in a schematic representation.

FIG. 1 shows a magnetic resonance device 11 for carrying out a method according to the disclosure in a schematic representation. The magnetic resonance device 11 comprises a detector unit formed of a magnet unit 13 with a main magnet 17 for generating a strong and in particular constant main magnetic field 18. Furthermore, the magnetic resonance device 11 has a cylindrical patient receiving region 14 for receiving an examination object 15, wherein the patient receiving region 14 is cylindrically enclosed in a circumferential direction by the magnet unit 13. The examination object 15 can be pushed into the patient receiving region 14 by means of a patient positioning apparatus 16 of the magnetic resonance device 11. For this purpose, the patient positioning apparatus 16 has a patient table which is arranged movably within the magnetic resonance device 11.

The magnet unit 13 also has a gradient coil unit 19 which is used for a position encoding during an imaging process. The gradient coil unit 19 is actuated by means of a gradient control unit 28. Furthermore, the magnet unit 13 has a radio-frequency antenna unit 20 which, in the case shown, is embodied as a body coil permanently integrated into the magnetic resonance device 11, and a radio-frequency antenna control unit 29 for an excitation of a polarization which occurs in the main magnetic field 18 generated by the main magnet 17. The radio-frequency antenna unit 20 is actuated by the radio-frequency antenna control unit 29 and radiates high-frequency radio-frequency pulses into an examination space which is substantially formed by the patient receiving region 14.

For controlling the main magnet 17, the gradient control unit 28 and the radio-frequency antenna control unit 29, the magnetic resonance device 11 has a control unit 24. The control unit 24 centrally controls the magnetic resonance device 11, such as for example the execution of MR control sequences. Furthermore, the control unit 24 comprises a reconstruction unit (not shown in detail) for reconstructing medical image data which is acquired during the magnetic resonance examination. The magnetic resonance device 11 has a display unit 25. Control information, such as for example control parameters, and reconstructed image data can be displayed on the display unit 25, for example on at least one monitor, for a user. In addition, the magnetic resonance device 11 has an input unit 26 by means of which information and/or control parameters can be input by a user during a scanning procedure. The control unit 24 can comprise the gradient control unit 28 and/or radio-frequency antenna control unit 29 and/or the display unit 25 and/or the input unit 26.

The control unit 24 further comprises a correction unit 33. The correction unit 33 is also configured to carry out a method for correcting TOF MR data 42. For this purpose, the correction unit 33 has computer programs and/or software which can be directly loaded into a memory unit (not shown in detail) of the correction unit 33, having program means in order to carry out a method for correcting TOF MR data 42 when the computer programs and/or software are executed in the correction unit 33. For this purpose, the correction unit 33 has a processor (not shown in detail) which is configured to execute the computer programs and/or software. Alternatively, the computer programs and/or software can also be stored on an electronically readable data carrier 21 embodied separately from the control unit 24 and/or the correction unit 33, wherein a data access by the correction unit 33 can take place on the electronically readable data carrier 21 via a data network.

The magnetic resonance device 11 shown can naturally comprise further components which magnetic resonance devices 11 typically have. A general mode of operation of a magnetic resonance device 11 is also known to a person skilled in the art, so that a detailed description of the further components is not included. The magnetic resonance device 11 is thus designed, together with the correction unit 33, to carry out a method according to the disclosure.

A method for correcting TOF MR data 42 can also exist in the form of a computer program product which implements the method on the correction unit 33 when it is executed on the correction unit 33. An electronically readable data carrier 21 with electronically readable control information stored thereon can also be provided, said control information comprising at least one computer program product such as just described and being configured such that, when the electronically readable data carrier 21 is used in a correction unit 33 of a magnetic resonance device 11, said control information carries out the method described.

Figure 2:
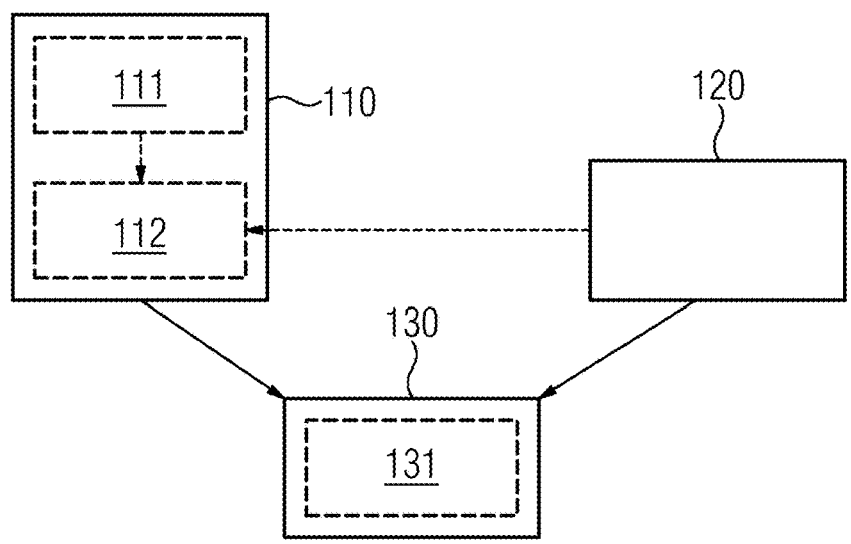
FIG. 2 shows a flow diagram of a first aspect of a method according to the disclosure.

FIG. 2 shows a flow diagram of a first aspect of a method according to the disclosure. With method step 110, the method according to the disclosure provides that a coil sensitivity map 41 is provided for an examination region 12 of the examination object 15. Method step 120 comprises providing the TOF MR data 42 of the examination region 12. The method steps 110 and 120 can take place simultaneously or at least partially consecutively. Method step 130 comprises multiplying the TOF MR data 42 by an inverse of the coil sensitivity map 41, as a result of which the corrected TOF MR image data 43 is generated. Optionally, the first aspect of the method according to the disclosure during the provision of the TOF MR data 42 in method step 110 with method step 111 can comprise recording TOF MR raw data by means of a magnetic resonance device 11 from the examination object 15 and with method step 112 reconstructing the TOF MR raw data to form image data, wherein the TOF MR data 42 is embodied as image data. The reconstruction of the TOF MR raw data to form image data in method step 112 preferably takes place taking into consideration the coil sensitivity map 41. Optionally and independently from the method steps 111, 112, the first aspect of the method according to the disclosure during method step 130 during multiplication of the TOF MR data 42 by an inverse of the coil sensitivity map 41 can comprise multiplication by a compensation factor according to method step 131.

Figure 3:
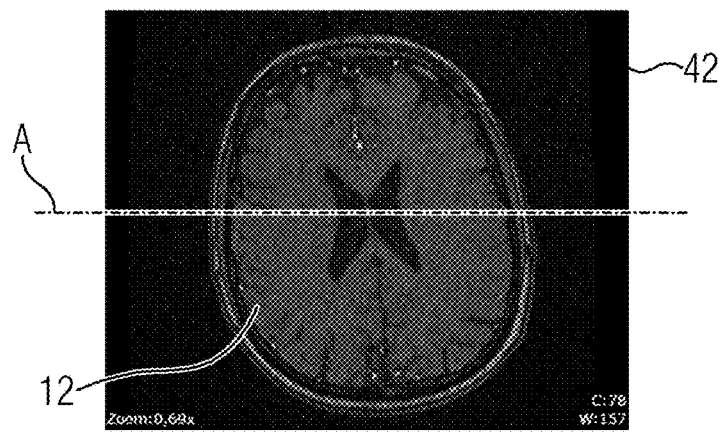
FIG. 3 shows TOF MR data before an aspect of a method according to the disclosure is carried out.

FIG. 3 shows TOF MR data 42 before an aspect of a method according to the disclosure is carried out. The TOF MR data 42 is embodied as image data and the examination region 12 comprises a head. The TOF MR data 42 has been generated by actuating a magnetic resonance device 11 having a main magnet 17 of 0.55 tesla according to an MR control sequence, in particular a gradient-echo-based MR control sequence, free from fat saturation. The subcutaneous fat in particular has a particularly high signal strength.

Figure 4:
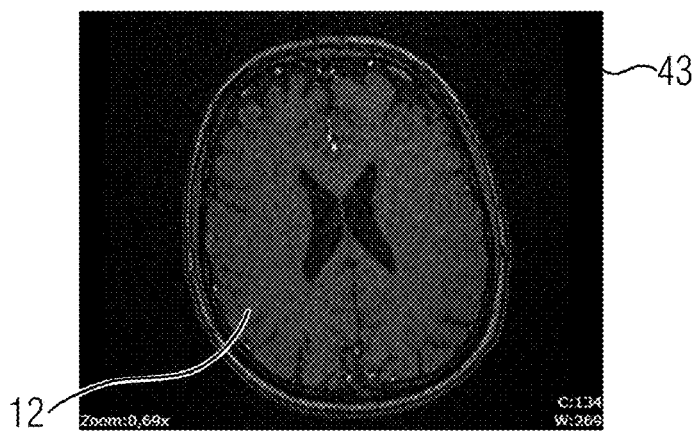
FIG. 4 shows corrected TOF MR image data.

FIG. 4 shows corrected TOF MR image data 43, which has been generated by means of the method according to the disclosure from the TOF MR data 42 shown in FIG. 3. The subcutaneous fat in the peripheral region is darker in comparison to the TOF MR data 42 shown in FIG. 3.

Figure 5:
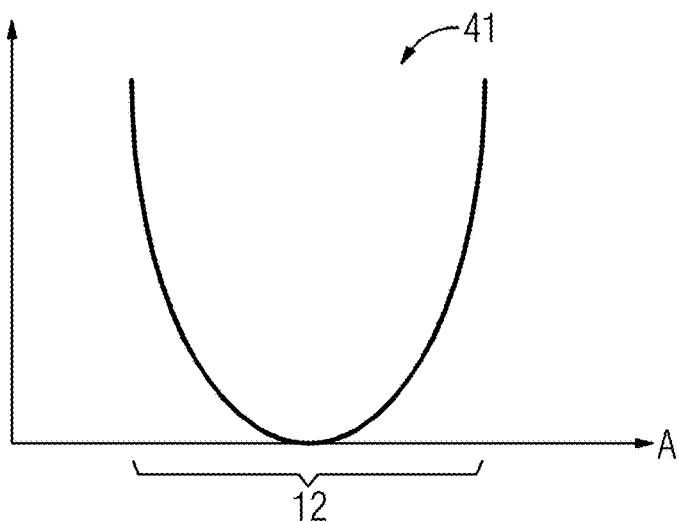
FIG. 5 shows a longitudinal section of a coil sensitivity map in a two-dimensional graphical view.

FIG. 5 shows a longitudinal section of a coil sensitivity map 41 in a two-dimensional graphical view, wherein in the vertical direction the strength of the coil sensitivity is shown as a function of the line A shown in FIG. 3. The coil sensitivity map 41 has a lower amplitude in the central region of the examination region 12, particularly in the center of the head, than in a peripheral region of the examination region 12, particularly in the region of the subcutaneous fat. The TOF MR data 42 shown in FIG. 3 has a higher spatial resolution than the coil sensitivity map 41.

Figure 6:
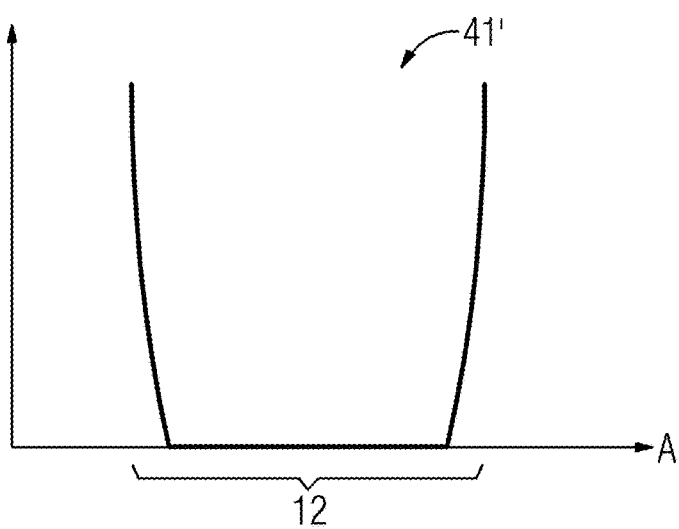
FIG. 6 shows a longitudinal section of a coil sensitivity map multiplied by a first compensation factor in a two-dimensional graphical view.

FIG. 6 shows a longitudinal section of a coil sensitivity map 41' multiplied by a first compensation factor in a two-dimensional graphical view, wherein the first compensation factor is greater than 1. This leads to an expansion of the coil sensitivity map 41 and thus to a strengthening of the overcompensation of the peripheral region of the examination region 12, particularly in the region of the subcutaneous fat, in comparison to the omission of the first compensation factor. The central region of the examination region 12, particularly the center of the head, which is affected slightly and/or unaffected by the correction, is enlarged in comparison to the omission of the first compensation factor. This applies in particular insofar as the TOF MR data is embodied as image data which has already been reconstructed taking into consideration the coil sensitivity map.

Figure 7:
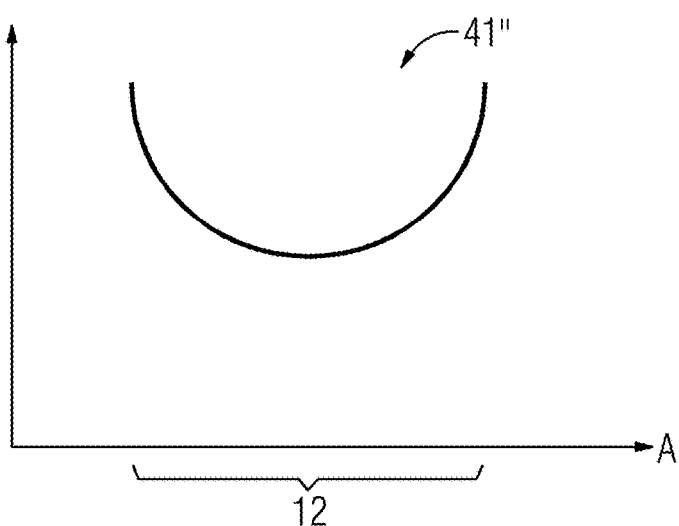
FIG. 7 shows a longitudinal section of a coil sensitivity map multiplied by a second compensation factor in a two-dimensional graphical view.

FIG. 7 shows a longitudinal section of a coil sensitivity map 41" multiplied by a second compensation factor in a two-dimensional graphical view, wherein the second compensation factor is less than 1. This leads to a contraction of the coil sensitivity map 41 and thus to a reduction of the overcompensation of the peripheral region of the examination region 12, particularly in the region of the subcutaneous fat, in comparison to the omission of the second compensation factor. When the coil sensitivity map 41" multiplied by the second compensation factor is used, the correction is generally less pronounced in comparison to the omission of the second compensation factor. This applies in particular insofar as the TOF MR data is embodied as image data which has already been reconstructed taking into consideration the coil sensitivity map.

Although the disclosure has been illustrated and described in detail by the preferred exemplary aspects, the disclosure is not restricted by the examples disclosed and other variations can be derived therefrom by a person skilled in the art without departing from the protective scope of the disclosure.

The invention claimed is:

1. A method for correcting time-of-flight (TOF) magnetic resonance (MR) data, the method comprising:
providing a coil sensitivity map for an examination region of an examination object;
providing the TOF MR data of the examination region; and
generating corrected TOF MR image data by multiplying the TOF MR data by an inverse of the coil sensitivity map.

2. The method for correcting TOF MR data of claim 1, wherein the provision of the TOF MR data comprises:
recording TOF MR data from the examination object by means of an MR device; and
reconstructing the TOF MR raw data to form image data, wherein the TOF MR data is embodied as image data.

3. The method for correcting TOF MR data of claim 2, wherein the reconstruction of the TOF MR raw data to form image data takes place taking into consideration the coil sensitivity map for homogenizing the image data.

4. The method for correcting TOF MR data of claim 1, wherein the coil sensitivity map has a lower amplitude in a central region of the examination region than in a peripheral region of the examination region.

5. The method for correcting TOF MR data of claim 1, wherein the TOF MR data is embodied as image data and has a higher spatial resolution than the coil sensitivity map.

6. The method for correcting TOF MR data of claim 1, wherein the multiplication of the TOF MR data by an inverse of the coil sensitivity map comprises multiplying the TOF MR data by an inverse of a compensation factor.

7. The method of claim 6, wherein the compensation factor has a value of at least 1.1.

8. The method for correcting TOF MR data of claim 1, wherein the provision of the TOF MR data comprises actuating an MR device according to an MR control sequence, and the MR device has a main magnetic field strength of at most 1.3 tesla.

9. The method for correcting TOF MR data of claim 1, wherein the provision of the TOF MR data comprises actuating an MR device according to an MR control sequence free from fat saturation.

10. A magnetic resonance device with a controller, comprising a correction unit which is configured to carry out a method for correcting TOF MR data as claimed in claim 1.

11. A non-transitory computer readable data carrier on which a program is stored which is embodied such that, when the data carrier is used in a correction unit, the program carries out the method for correcting TOF MR data as claimed in claim 1.

* * * * *